(12) United States Patent
Kawahara

(10) Patent No.: US 6,829,318 B2
(45) Date of Patent: Dec. 7, 2004

(54) PLL SYNTHESIZER THAT USES A FRACTIONAL DIVISION VALUE

(75) Inventor: Tadashi Kawahara, Tokyo (JP)

(73) Assignees: Renesas Technology Corp., Tokyo (JP); Mitsubishi Electric Engineering Co., Ltd., Tokyo (JP)

(*) Notice: Subject to any disclaimer, the term of this patent is extended or adjusted under 35 U.S.C. 154(b) by 502 days.

(21) Appl. No.: 09/885,927

(22) Filed: Jun. 22, 2001

(65) Prior Publication Data

US 2002/0097825 A1 Jul. 25, 2002

(30) Foreign Application Priority Data

Jan. 23, 2001 (JP) ........................................ 2001-015001

(51) Int. Cl.[7] ................................................ H03D 3/24
(52) U.S. Cl. ........................ 375/376; 375/374; 327/148; 327/157
(58) Field of Search ................................ 375/376, 374, 375/294; 331/1 A, 57; 327/156, 159, 148, 157, 147

(56) References Cited

U.S. PATENT DOCUMENTS

| 5,180,993 | A | | 1/1993 | Dent |
| 5,818,303 | A | * | 10/1998 | Oishi et al. .................. 331/1 A |
| 5,834,987 | A | | 11/1998 | Dent |
| 5,847,611 | A | * | 12/1998 | Hirata ......................... 331/1 A |
| 6,130,561 | A | | 10/2000 | Dufour |
| 6,515,525 | B2 | * | 2/2003 | Hasegawa ................... 327/156 |

FOREIGN PATENT DOCUMENTS

| EP | 147307 | 7/1985 |
| JP | 9-18339 | 1/1997 |
| JP | 10-154935 | 6/1998 |
| JP | 10-190457 | 7/1998 |

* cited by examiner

*Primary Examiner*—Temesghen Ghebretinsae
(74) *Attorney, Agent, or Firm*—Leydig, Voit & Mayer, Ltd.

(57) ABSTRACT

A phase locked loop (PLL) frequency synthesizer has a phase comparator, a voltage-controlled oscillator, a charge pump circuit, a loop filter, a variable frequency divider periodically changing a division value in response to a frequency division value changing circuit, and a charge pump bias circuit for supplying a modulated reference bias current, for canceling a phase error, to the charge pump circuit. As a result, without generating additional spurious components, conventionally-generated spurious components can be suppressed.

9 Claims, 14 Drawing Sheets

HAVE SAME SURFACE AREAS

FIG.16

$$e(x) = \frac{A}{2} + \frac{2A}{\pi} \frac{Fref}{Fosc} \times \sum_{N=1}^{\infty} \frac{sinNx}{N} \quad \cdots (1)$$

$$\frac{1}{Fref - N/Fvco} = \frac{\frac{3N}{Fvco} + \frac{(N+1)}{Fvco}}{4} - N/Fvco = \frac{1}{4 \times Fvco} \quad \cdots (2)$$

$$\begin{array}{c}\text{CHARGE PUMP}\\\text{MODULATION}\\\text{CURRENT}\\\text{INCREMENT STEP}\end{array} \times \begin{array}{c}\text{NAND GATE}\\\text{DELAY TIME}\\\text{OF FOUR}\\\text{GATES}\end{array} = \frac{1}{2^k \times Fvco} \times \begin{array}{c}\text{CHARGE}\\\text{PUMP}\\\text{CURRENT}\end{array} \quad \cdots (3)$$

$$\begin{array}{c}9\\\text{STAGES}\end{array} \times \begin{array}{c}\text{DELAY TIME}\\\text{PER GATE}\end{array} = \frac{1}{Frosc} \times \frac{1}{2} \quad \cdots (4)$$

$$\begin{array}{c}\text{INCREMENT STEP}\\\text{OF MODULATION}\\\text{REFERENCE BIAS}\\\text{CURRENT VALUE}\end{array} = \frac{\begin{array}{c}\text{CHARGE PUMP}\\\text{CURRENT VALUE}\end{array}}{2^k \times Fvco \times \begin{array}{c}\text{PHASE COMPARATOR}\\\text{GATE DELAY TIME}\end{array}} \quad \cdots (5)$$

$$\begin{array}{c}\text{INCREMENT STEP}\\\text{OF MODULATION}\\\text{REFERENCE BIAS}\\\text{CURRENT VALUE}\end{array} = \frac{\begin{array}{c}\text{CHARGE PUMP}\\\text{CURRENT VALUE}\end{array}}{2^k \times Fvco} \times \frac{9}{4} \times 2 \times Frosc \quad \cdots (6)$$

PLL SYNTHESIZER THAT USES A FRACTIONAL DIVISION VALUE

FIELD OF THE INVENTION

The present invention relates to a phase locked loop (PLL) frequency synthesizer, that uses a division value below the decimal point, which realizes a reduction in spurious components.

BACKGROUND OF THE INVENTION

A PLL frequency synthesizer that uses a division value below the decimal point ("PLL frequency synthesizer") is a frequency synthesizer in which a division value below the decimal point can be set as an average division value by periodically changing the division value of a variable frequency divider. Such a PLL frequency synthesizer has two advantages. That is, (1) a reference frequency (phase comparison frequency) higher than channel interval can be set, and a small division value of a variable frequency divider can be set. Consequently, loop gain of the PLL is high and frequency can be changed at high speed. (2) Since a small division value can be set for a variable frequency divider, phase noise is reduced.

FIG. 13 shows the basic configuration of a conventional PLL frequency synthesizer. This PLL frequency synthesizer includes reference oscillator 1, frequency divider 2 for reference frequency, phase comparator 3, charge pump circuit 4, loop filter 5, voltage-controlled oscillator 6, variable frequency divider 7, division value changing circuit 8, shift register 9, adder 10, accumulator 11, and phase error compensating circuit 12.

Operation of the conventional PLL frequency synthesizer will be described by referring to FIG. 13 and FIG. 14. The reference oscillator 1 outputs a signal Fosc to the frequency divider 2, and the frequency divider 2 outputs a reference frequency signal Fref obtained by frequency-dividing the signal Fosc to the phase comparator 3. The phase comparator 3 compares an output of the variable frequency divider 7 with the reference frequency signal Fref, and outputs an UP signal or a DOWN signal to the charge pump circuit 4. The loop filter 5 receives an output current of the charge pump circuit 4, converts it into voltage, and outputs the voltage to the voltage-controlled oscillator 6. Signal Fvco is output from the voltage-controlled oscillator 6 to the variable frequency divider 7. In such a manner, a PLL loop is configured.

If the PLL uses an integer division value, an integer division value is directly supplied to the variable frequency divider 7. If the PLL uses a division value below the decimal point, the division value changing circuit 8 connected to the shift register 9 is used. By periodically outputting the division value N or N+1 to the variable frequency divider 7, an equivalent division value below the decimal point can be realized. The division value of the variable frequency divider 7 is preset in the shift register 9. The integer division value is supplied to the adder 10 in the division value changing circuit 8, and the division value below the decimal point is supplied to the accumulator 11. Specifically, the division value changing circuit 8 performs a division value changing operation so that N+1 is used only m times in the $2^k$ pulses of the reference frequency signal Fref and N is used ($2^k$ m) times, thereby enabling the division value of $(N+m)/2^k$ to be equivalently set as an average division value.

FIG. 14 shows an example of the relations among the reference frequency Fref, output of the variable frequency divider 7, and phase error output when m=1 and k=2, that is, the division value is (N+1)/4. In this example, by using the division value N for three outputs out of four outputs of the variable frequency divider 7 and using the division value N+1 for the rest, that is, one output, an average division value of the four division values is set to (N+1)/4. However, phase error occurs between the reference frequency Fref and the output of the variable frequency divider 7, and a phase error amount (phase lead in this case) is output as a signal from the phase comparator 3. Since the cycle of the signals is four times as many as that of the reference frequency Fref signals, a frequency spurious component of ¼ of the reference frequency occurs.

Consequently, in the conventional technique, as shown in FIG. 13 and FIG. 14, output proportional to output signal of the accumulator 11 is added to the loop filter 5 by the phase error compensating circuit 12, thereby canceling a phase error caused by the frequency dividing operation using the division value below the decimal point.

In a phase error compensation output in the conventional configuration, however, an output pulse has a cycle equal to or higher than integer times of the output signal Fosc of the reference oscillator 1. Even if half of the output signal Fosc is output to the phase error compensating circuit 12, a period of phase error compensation output from the phase error compensating circuit 12 becomes the period (2/Fosc) indicated by the arrows in FIG. 14, so that another spurious component is generated. The spurious component generated at this time has a waveform as shown in FIG. 15. FIG. 15 shows the pulse waveform e(x) which is obtained from Fourier series development based on equation (1) shown in FIG. 16.

When the reference frequency Fref is high and the division value for the reference frequency is small, the value of Fref/Fosc is large, and the pulse width of a phase error compensation output is accordingly wide. When the value is used as a control voltage for the voltage-controlled oscillator 6, due to the pulse waveform, a frequency spurious component is generated.

Specifically, for example, in PHS (Portable Handyphone System), Fvco is equal to 1.7 GHz and Fref is equal to 300 KHz. Thus, the frequencies are relatively high. Although the spurious component generated due to a phase error is attempted to be canceled by the conventional configuration, the width of the phase error compensation pulse cannot be reduced relative to the phase error pulse. Instead, a spurious component due to a phase error compensation pulse is generated.

SUMMARY OF THE INVENTION

It is an object of this invention to obtain a PLL frequency synthesizer that uses a division value below the decimal point, which does not generate a spurious component as described above.

According to this invention, there is provided a PLL frequency synthesizer that uses a division value below the decimal point which comprises a phase comparator; a voltage-controlled oscillator; a charge pump circuit; a loop filter; a variable frequency divider capable of periodically changing a division value by a division value changing circuit; and a charge pump bias circuit which supplies modulation reference bias current for canceling a phase error amount to the charge pump circuit.

Other objects and features of this invention will become apparent from the following description with reference to the accompanying drawings.

BRIEF DESCRIPTION OF THE DRAWINGS

FIG. 16 shows numerical expressions used in the description of the first embodiment.

DESCRIPTION OF THE PREFERRED EMBODIMENTS

Figure 1:
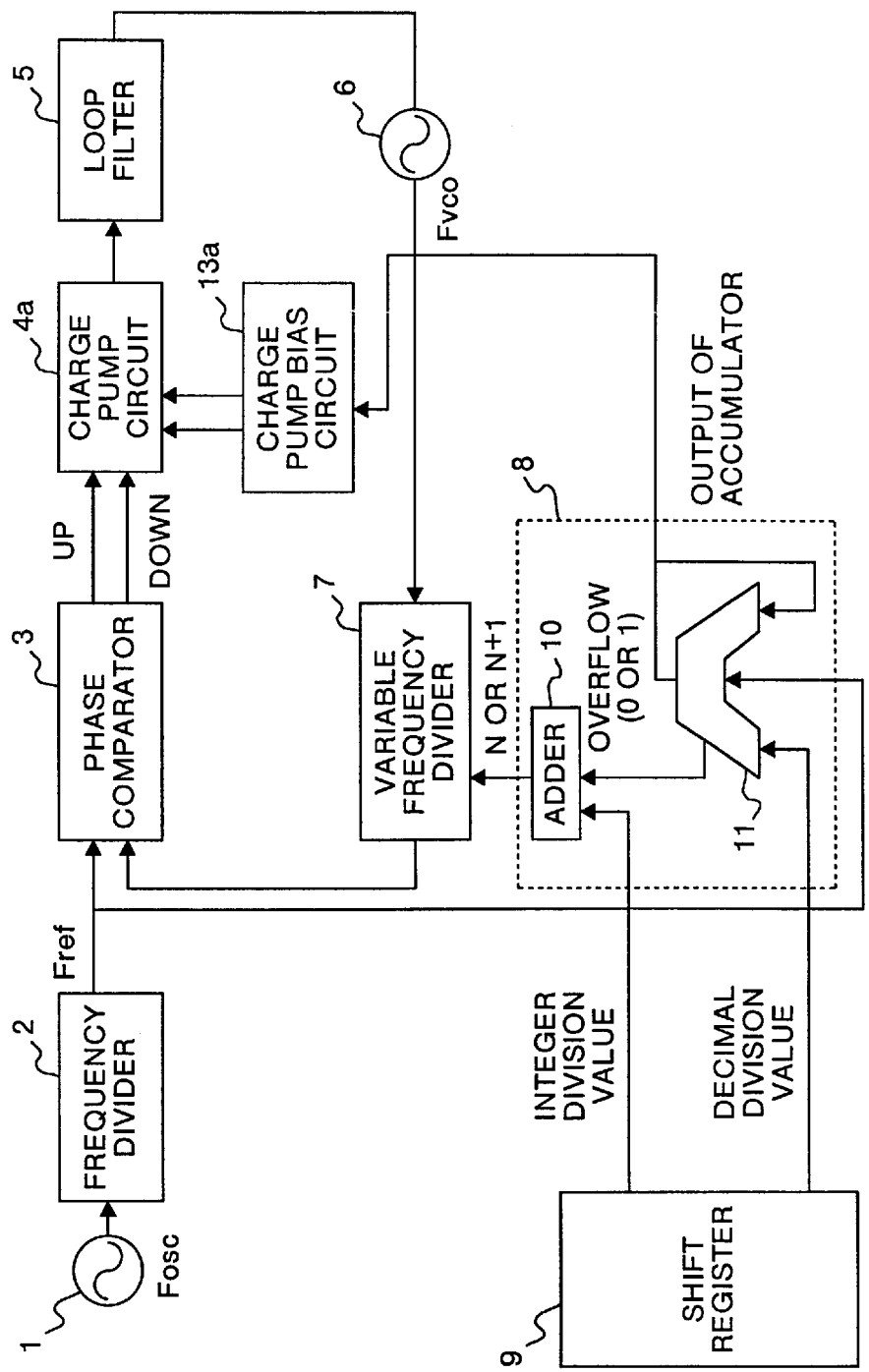
FIG. 1 is a diagram showing the configuration of a PLL frequency synthesizer that uses a division value below the decimal point according to a first embodiment of this invention.
Figure 13:
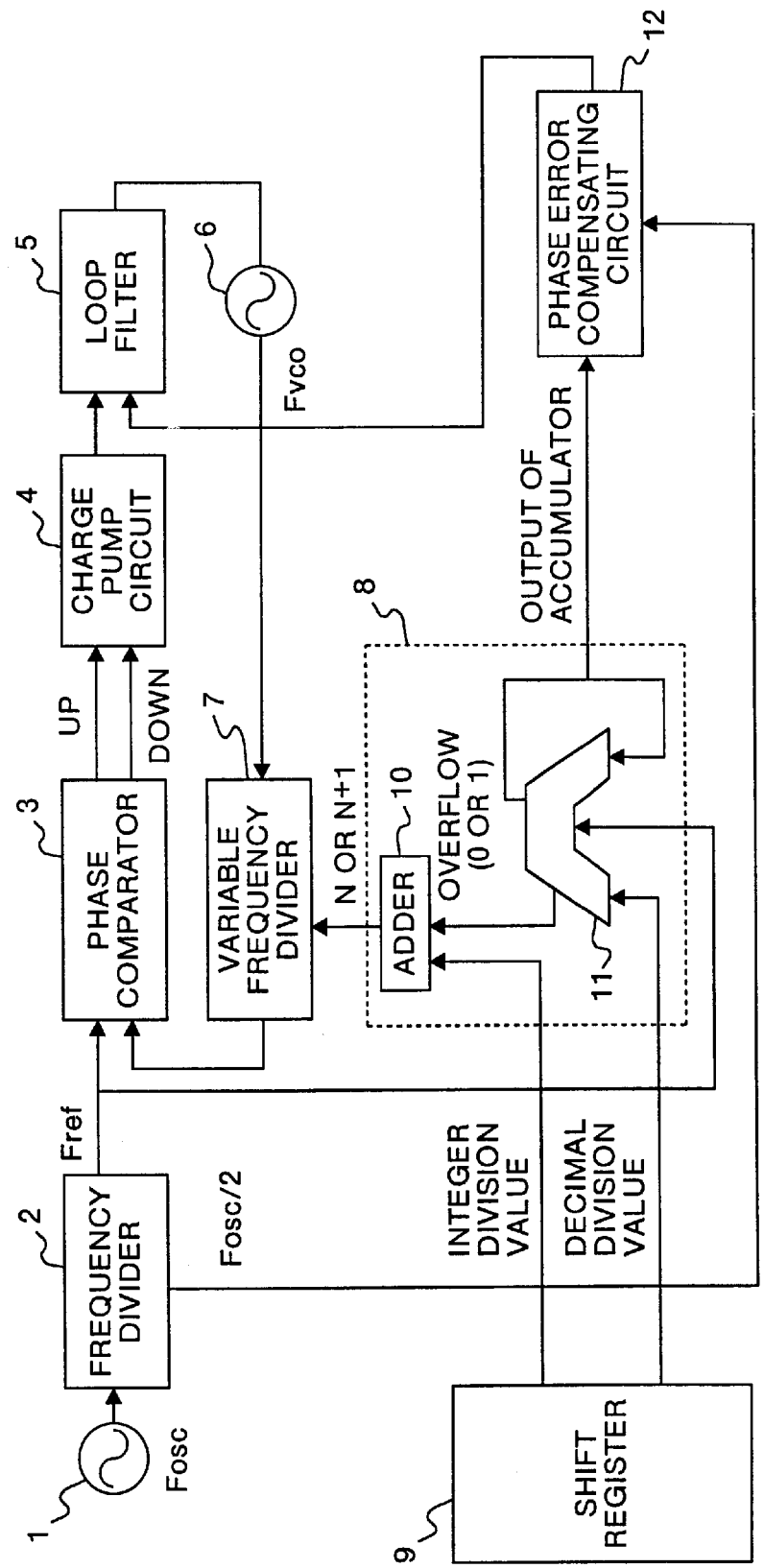
FIG. 13 is a diagram showing the configuration of a conventional PLL frequency synthesizer that uses a division value below the decimal point.
Figure 14:
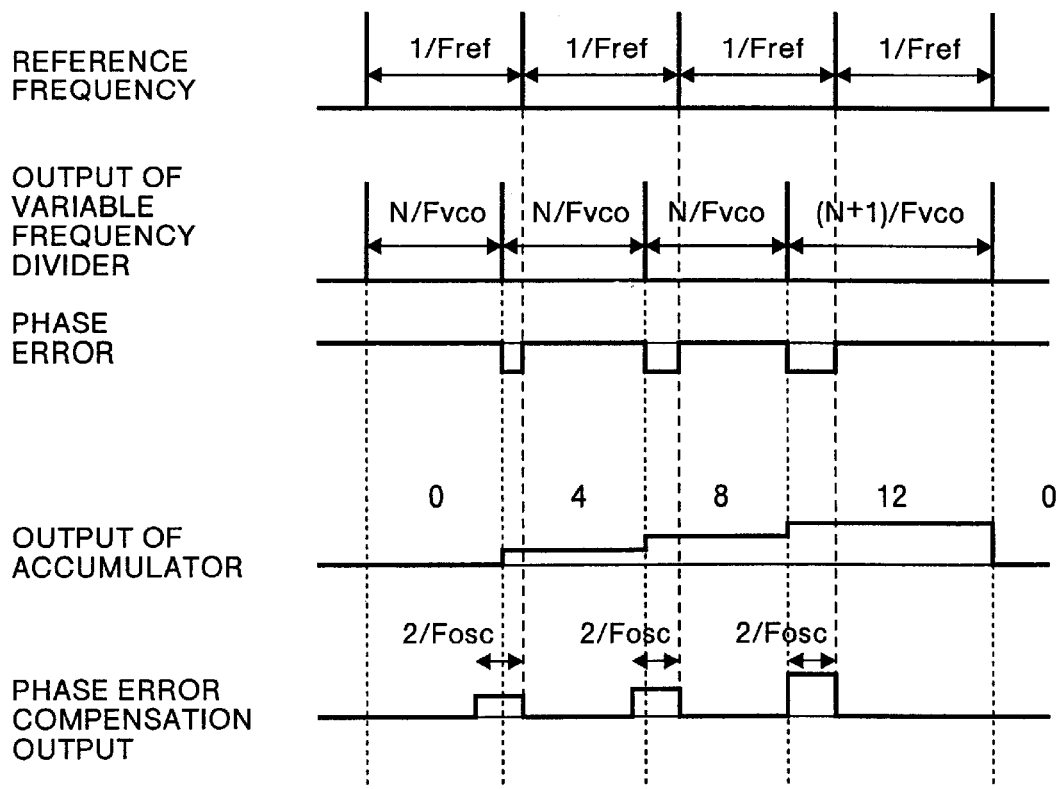
FIG. 14 is a diagram showing the relations among a conventional reference frequency signal, an output signal of a variable frequency divider, and a phase error output.
Figure 15:
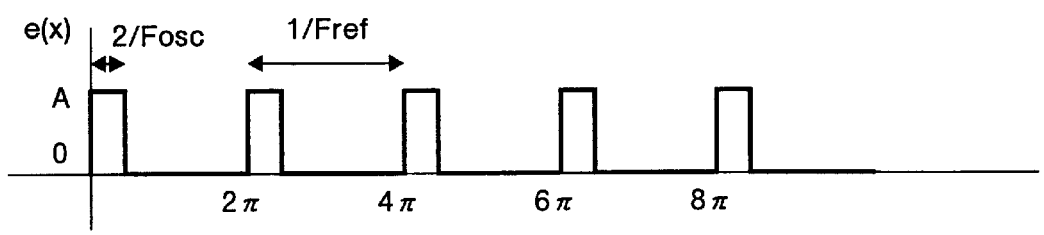
FIG. 15 is a diagram showing a conventional spurious component generated.

FIG. 1 shows a PLL frequency synthesizer that uses a division value below the decimal point ("PLL frequency synthesizer") according to the first embodiment of this invention. Components provided with reference numerals from 1 through 3 and 5 through 11 are same as those in the conventional configuration shown in FIG. 13. Charge pump circuit 4a is provided in place of the charge pump circuit 4 shown in FIG. 13. The charge pump circuit 4a is different from the conventional charge pump circuit 4 in that it receives signal from a newly provided charge pump bias circuit 13a. The phase error compensating circuit 12 shown in FIG. 13 is not provided in the PLL frequency synthesizer according to this embodiment. The charge pump bias circuit 13a receives an output value of the accumulator 11 and outputs a signal to the charge pump circuit 4a as shown in FIG. 2.

In the configuration of an ordinary PLL loop, a prescalar is provided between the variable frequency divider 7 and the voltage-controlled oscillator 6. Since the prescalar is not directly related to the operation of the invention, it is not shown for simplicity of explanation.

Figure 2:
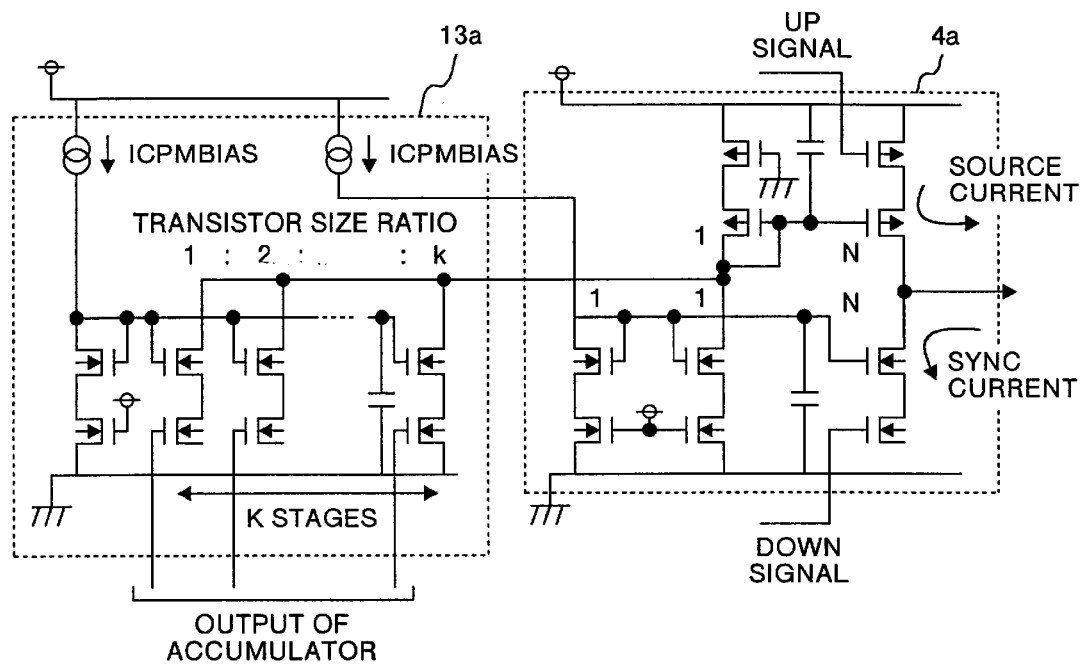
FIG. 2 is a circuit diagram of a charge pump circuit and a charge pump bias circuit in the first embodiment.

As shown in FIG. 2, the charge pump bias circuit 13a takes the form of a current mirror circuit of K stages in which ICPMBIAS is used as a reference bias current, and the transistor size is changed so that mirror current becomes $1:2^1:2^2:\ldots:2^{k-1}$. The drains of N-channel MOS transistors are connected as a common output which is connected to the drain of a P-channel MOS transistor as a source reference bias current source of the charge pump circuit 4a. Output of the accumulator 11 (K bits in the case of FIG. 2) is connected to the gates of the N-channel MOS transistors. An output of the small number of bits is connected to a circuit of a low mirror ratio. An output of the large number of bits is connected to a circuit of a high mirror ratio.

The charge pump bias circuit 13a constructed as described above generates a bias current proportional to a input value from the accumulator 11, which is added only to the source current of the charge pump circuit 4a.

The charge pump circuit 4a uses ICPBIAS as a reference bias current, increases the current value N times according to the mirror ratio of the current mirror circuit. Source current is output from a PMOS transistor in response to the UP signal from the phase comparator 3. Sync current is output from the NMOS transistor in response to the DOWN signal from the phase comparator 3.

Figure 3:
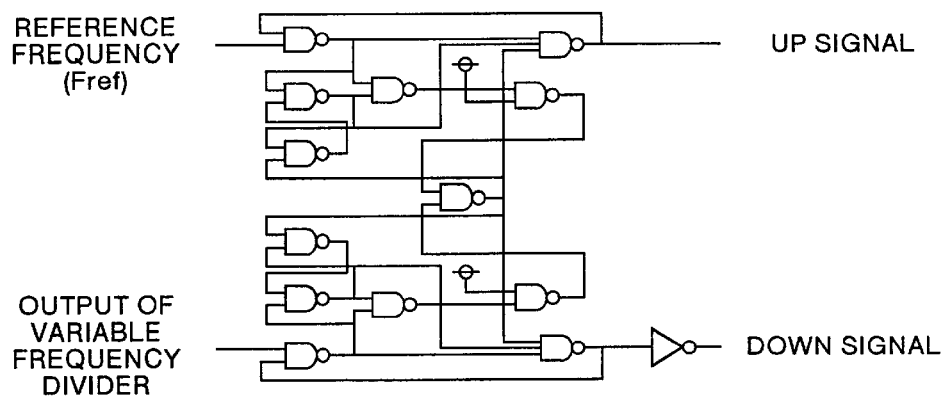
FIG. 3 is an internal configuration diagram of a phase comparator in the first embodiment.
Figure 4:
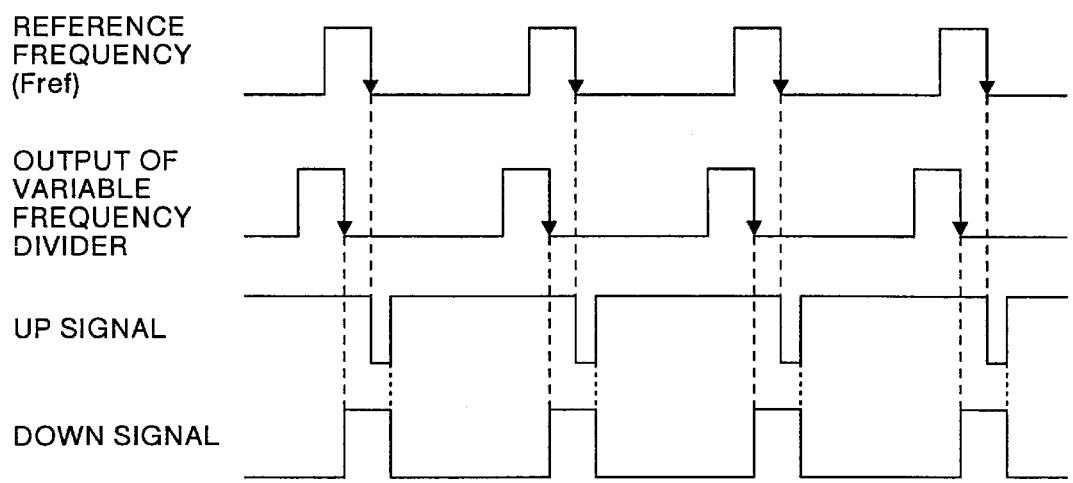
FIG. 4 is a diagram showing output signals of the phase comparator in the first embodiment.

FIG. 3 shows the internal configuration of the phase comparator 3. This phase comparator 3 is a digital phase comparator having therein a flip flop constructed by NAND devices. The phase comparator 3 outputs a pulse waveform corresponding to a phase difference at trailing edges of the reference frequency signal Fref and an output signal of the variable frequency divider 7. For example, when the signal of the variable frequency divider 7 is leading with respect to the reference frequency signal Fref, a DOWN signal corresponding to the phase difference as shown in FIG. 4 is generated. Although L output of the UP signal is generated in this case, it is intentionally generated by a signal delay in the phase comparator 3 to prevent a dead zone from being created in the phase comparator 3 and the charge pump circuit 4a. The duration of the L output of the UP signal is set to about few hundreds ps per NAND gate. Since four NAND gates are connected in the configuration of FIG. 3, it is set to about 1 ns.

Figure 5:
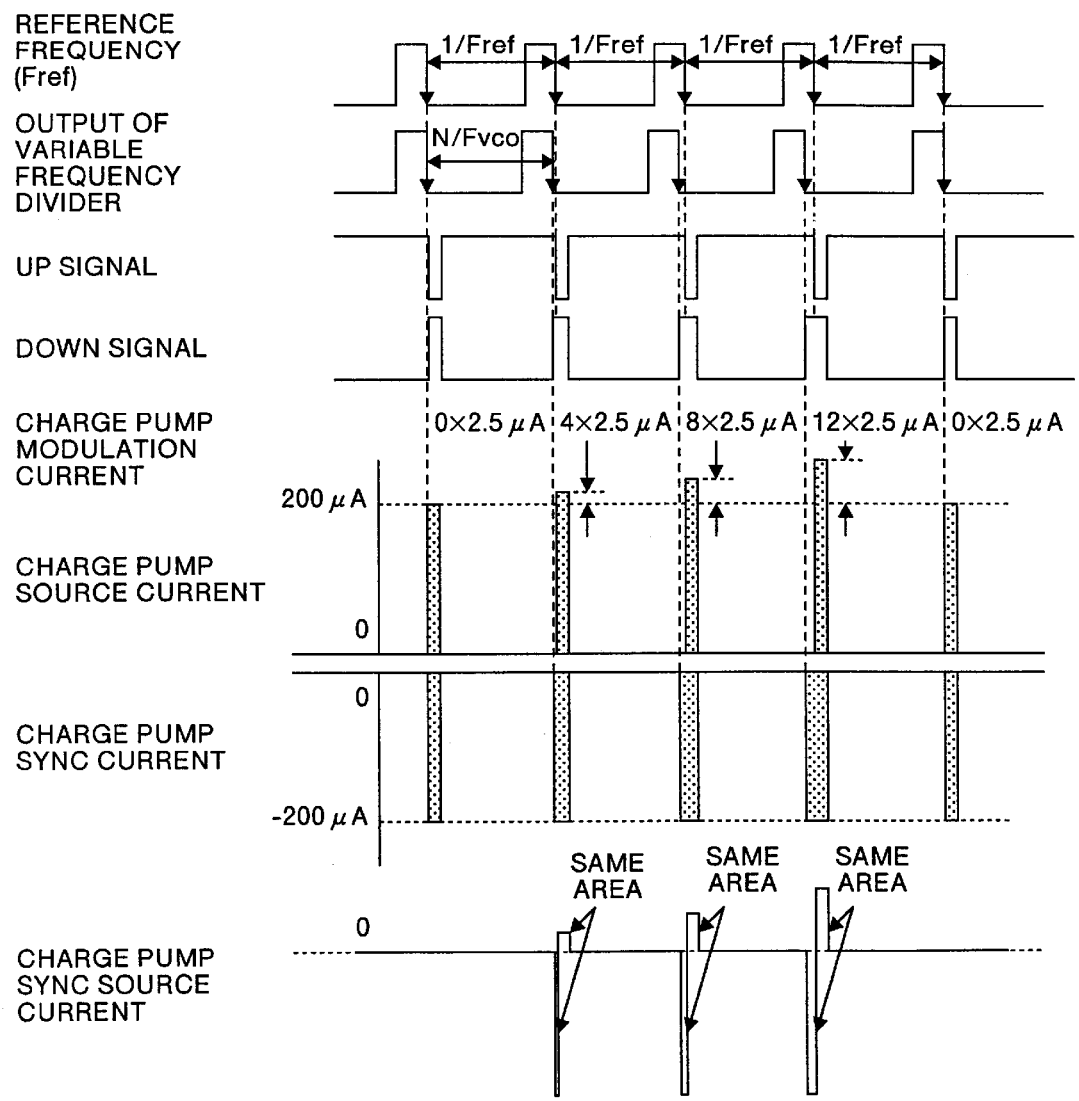
FIG. 5 is a diagram showing the relations among a reference frequency signal, an output signal of a variable frequency divider, and a phase error output in the first embodiment.

FIG. 5 shows the relations among the reference frequency signal Fref, the output signal of the variable frequency divider 7, and the phase error output at the time of frequency division by N+4/16.

Since a frequency dividing operation using a division value below the decimal point is performed in the example, the trailing edge of an output signal of the variable frequency divider is leading from the trailing edge of the reference frequency signal Fref. DOWN signal corresponding to the phase error is output from the phase comparator 3, and is passed as sync current of the charge pump circuit 4a to the loop filter 5. An overflow signal of the accumulator 11 is output four times out of 16 times. Consequently, a fluctuation of a phase error is repeated in the cycle of four pulses of the reference frequency signal Fref. An increment step of the phase error time can be expressed by equation (2) shown in FIG. 16. The phase error becomes zero every four times.

An example using specific numerical values will be described hereinbelow.

For example, when a charge pump output current value is set as 0.2 mA, the frequency of the signal Fvco as an output of the voltage-controlled oscillator 6 is set as 1.6662 GHz, k=4, and gate delay is 3 ns, based on equation (3) shown in FIG. 16, an increment step of the charge pump modulation current is derived as about 2.5 μA. In this case, outputs of the accumulator 11 are cyclic as 4, 8, 12, 0, 4, 8, 12, . . . , a current of 4×2.5 μA is applied for a first phase error amount, a current of 8×2.5 μA is applied for a second phase error amount, and a current of 12×2.5 μA is applied for a third phase error amount. By adding the modulation current of the amount corresponding to the phase error amount (same area in FIG. 5) as a charge pump source current, a modulation reference bias current is obtained and the phase error amount is canceled. In this manner, a spurious component conventionally generated at the time of performing the frequency dividing operation using a division value below the decimal point can be prevented from being generated.

Conventionally, a phase error compensation output pulse which is only integer times as high as the cycle of the signal Fosc of the reference oscillator 1 is generated. The technique causes a spurious frequency component. In the configuration of the first embodiment, the delay gate time of the phase comparator 3 is used and the modulation current is added to the charge pump source current, thereby obtaining the modulation reference bias current. With such a configuration, the phase error can be compensated with a fine pulse width of a few ns. Thus, the countermeasure against the spurious frequency component can be largely improved.

As shown in FIG. 3, the phase comparator 7 is constructed by a number of NAND gates. The characteristic value of the NAND gate is influenced by variations in a manufacturing process, variations in power supply voltage and, further, a change in ambient temperature. It makes the delay time of the phase comparator 7 itself vary. In some cases, the gate delay time is deviated from the optimum point for suppressing the spurious components.

In the second embodiment, a PLL frequency synthesizer that uses a division value below the decimal point, which has an automatic adjusting function dealing with the variation in delay time of the phase comparator 7 is provided.

Figure 6:
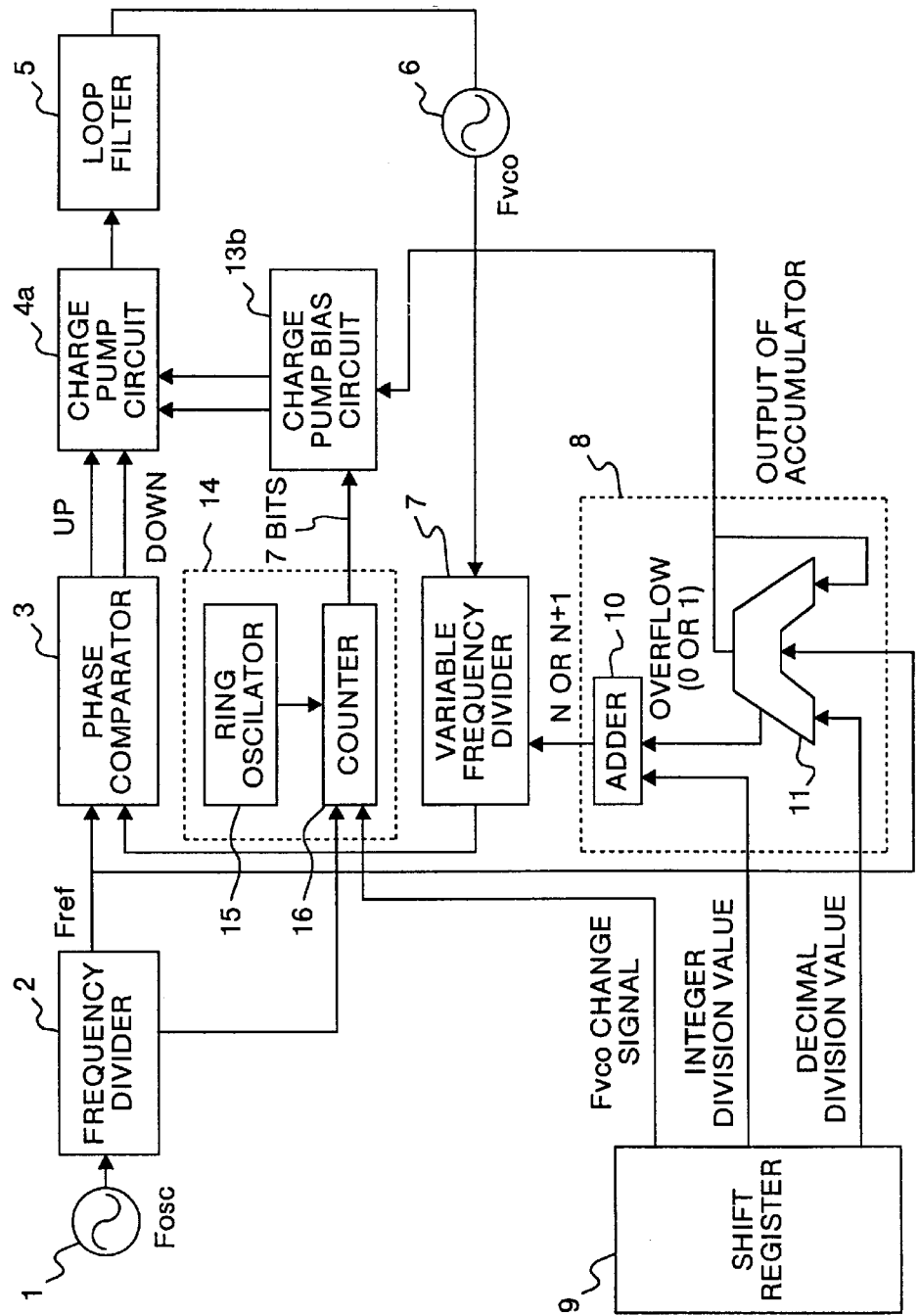
FIG. 6 is a diagram showing the configuration of a PLL frequency synthesizer that uses a division value below the decimal point according to a second embodiment of this invention.

FIG. 6 shows a PLL frequency synthesizer according to the second embodiment. The configuration of FIG. 6 is similar to that of FIG. 1. The differences are that, charge pump bias circuit 13b is provided in place of the charge pump bias circuit 13a, and gate delay adjusting circuit 14 is newly provided. The gate delay adjusting circuit 14 comprises a ring oscillator 15 and a counter 16.

Figure 7A:
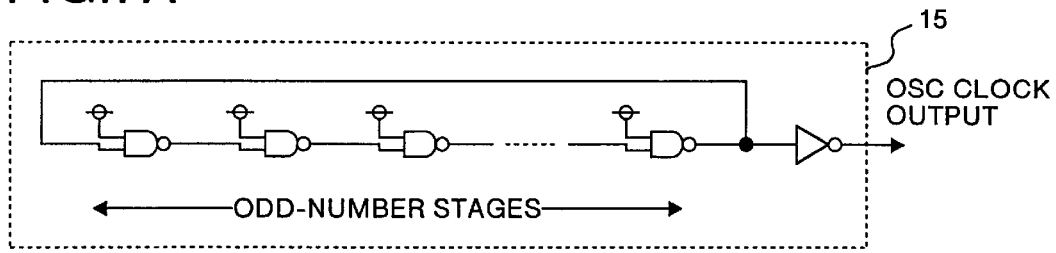
FIG. 7A to FIG. 7C are diagrams showing the internal configuration of a ring oscillator in the second embodiment.

FIG. 7A shows a general configuration of the ring oscillator ("OSC") 15. As shown in FIG. 7A, the OSC 15 is constructed by odd-number two-input NAND gates. One of the input terminals of each NAND gate is fixed at the H level, and the other input terminal and the output terminal are connected in a ring shape. The same NAND device (same shape and same characteristics) as that used in the phase comparator 7 is used. Preferably, the OSC 15 is disposed next to the phase comparator to minimize manufacturing variations.

Figure 7B:
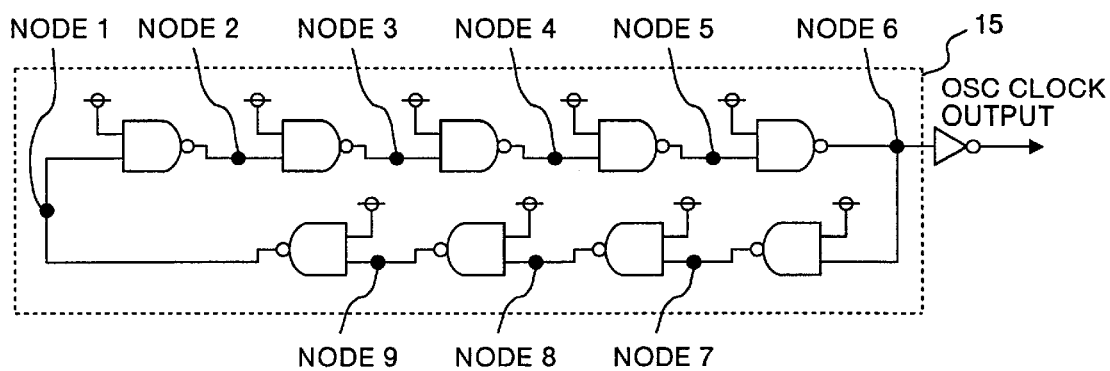
Figure 7C:
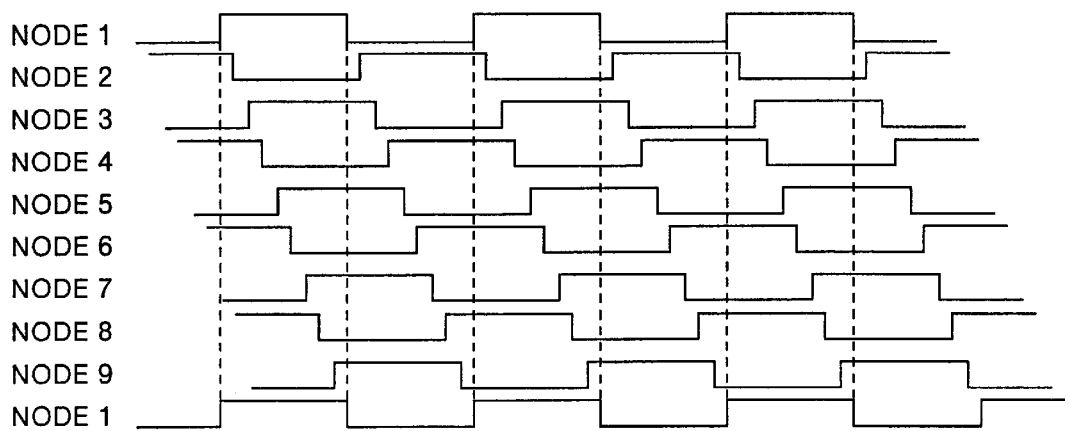

FIG. 7B shows a specific example in which the ring oscillator 15 is constructed by nine two-input NAND gates. As shown in FIG. 7C, the ring oscillator 15 oscillates so that the product of delay time per gate and the number of gates connected is equal to the half of a clock of the oscillation frequency ("Frosc") of the ring oscillator. Consequently, the delay time per nine gates is calculated using equation (4) shown in FIG. 16.

The increment step of the modulation reference bias current value can be expressed using equation (5) obtained by modifying equation (3) shown in FIG. 16.

In equations (4) and (5), since the two-input NAND devices of the same shape and same characteristics are used for both the phase comparator 7 and the OSC 15, fluctuations in gate delay time of the phase comparator 7 and the OSC 15 due to variations in power source voltage and those due to temperature can be regarded as the same. Consequently, when the gate delay time in the phase comparator 7 corresponds to an amount of four gates and the number of stages in the OSC 15 is set as nine, it can be expressed as equation (6) in which the fluctuations in gate delay time are canceled.

Figure 8:
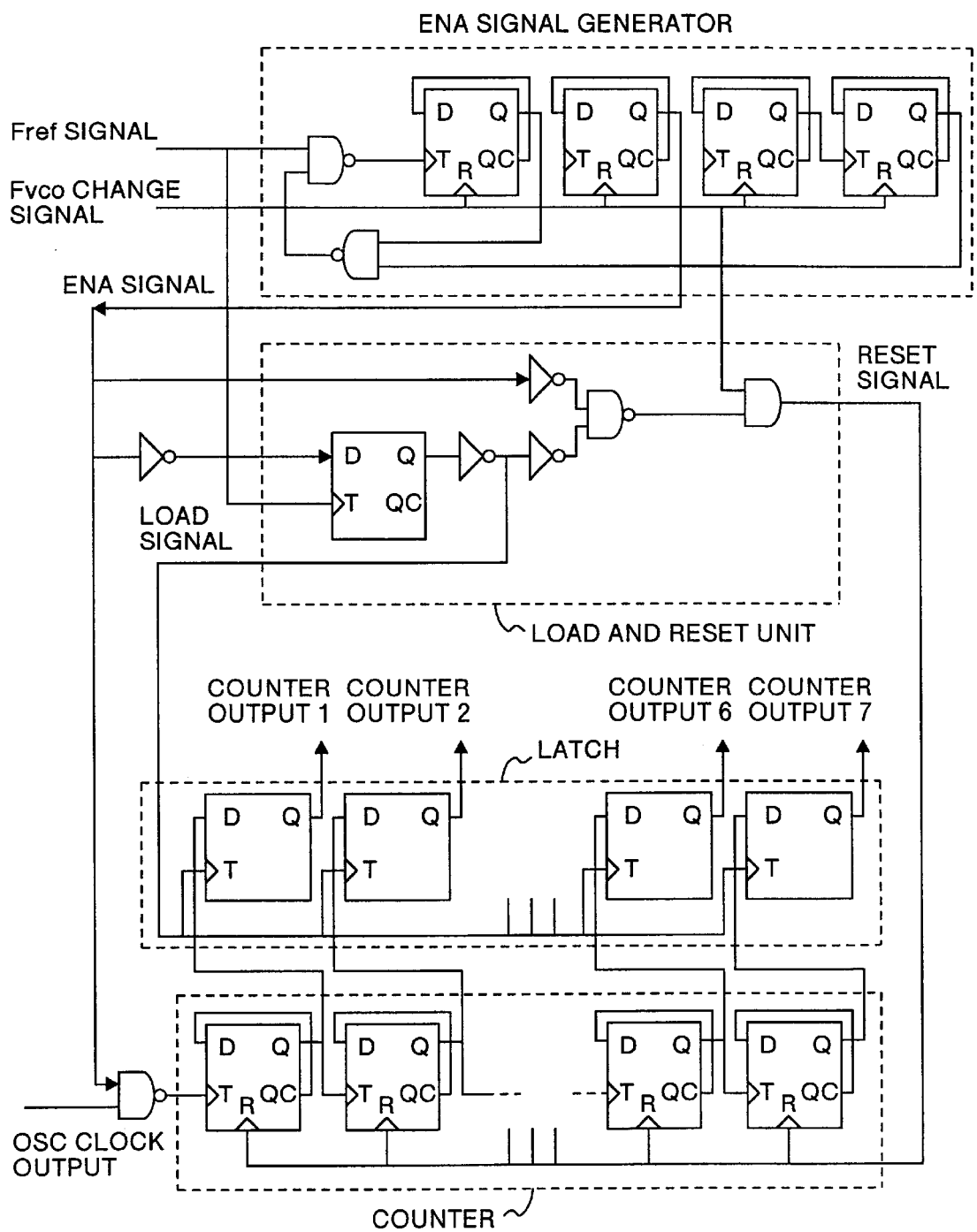
FIG. 8 is a diagram showing the internal configuration of a counter in the second embodiment.

FIG. 8 shows an example of the configuration of the counter 16 which is a circuit for outputting a bias digital value proportional to the signal Frosc. The circuit of FIG. 8 basically has an enable signal ("ENA signal") generator for generating ENA signal, a counter, a latch, and a load and reset unit for outputting a load signal and a reset signal.

When the frequency of a PLL is switched, the data in a shift register is updated. At that time, an Fvco changing signal is generated. By the Fvco changing signal and are set signal output from the load and reset unit in response to the Fvco changing signal, the flip flops in the ENA signal generator and the counter are reset.

Figure 9:
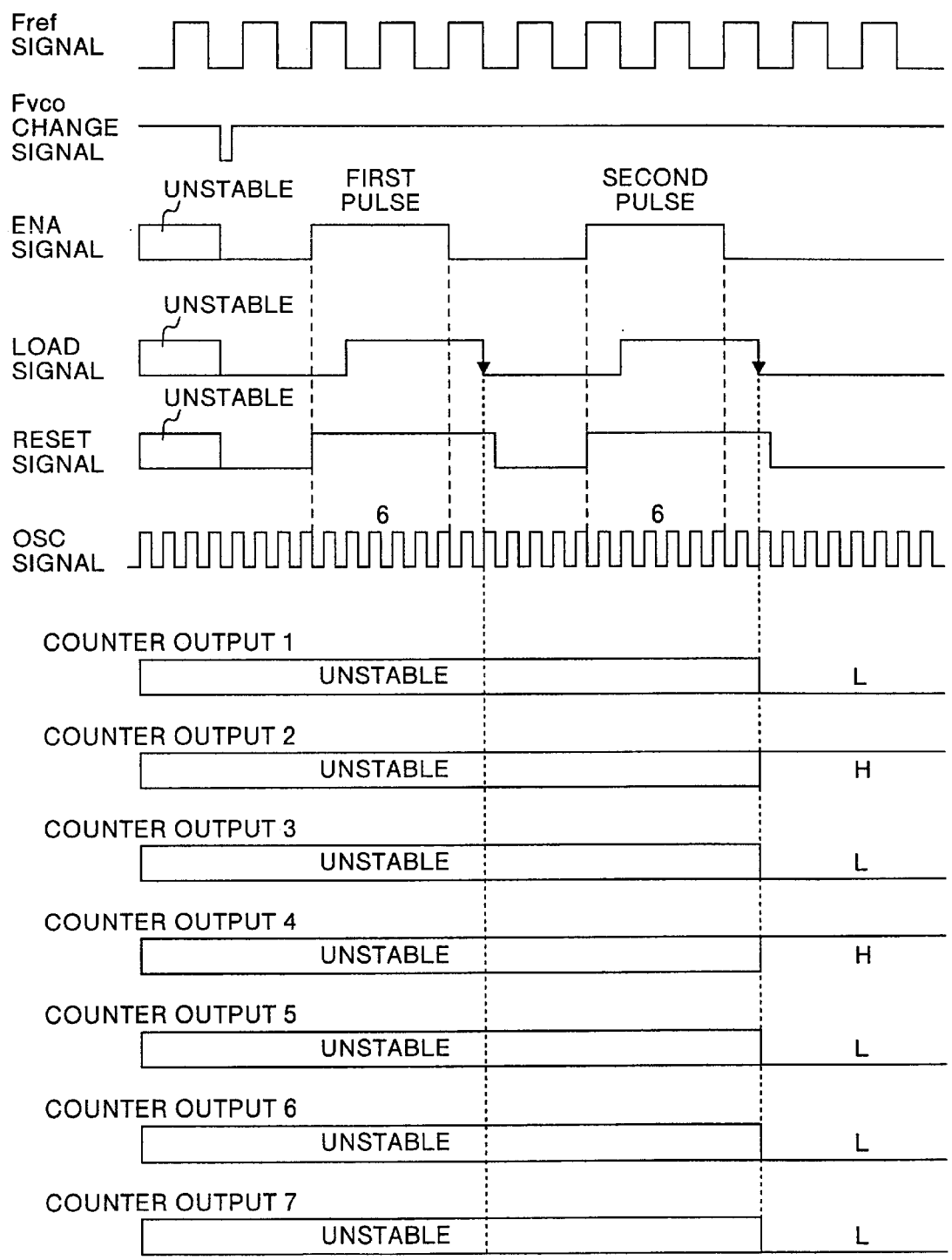
FIG. 9 is a diagram showing outputs of the counter in the second embodiment.

The ENA signal generator has a configuration in which four D-FFs are connected in series. A QC output of each D-FF is fed back to D, and a Q output is connected to a clock input terminal of the next D-FF. Since the ENA signal output is a Q output of the second D-FF, a waveform of the output signal which is ¼ of the Fref signal is obtained. Since a signal derived by calculating the NAND of the signal Fref and a signal obtained by calculating the NAND of Q outputs of the first and fourth D-FFs is fed back, after counting the Fref signal only nine times, no ENA signal is generated from the ENA signal generator. As the ENA signal, therefore, a signal having two pulses as shown in FIG. 9 is output. The signals in the first pulse are dummy signals when the D-FFs in the counter are unstable. The OSC clock signals Frosc are supplied to the counter during the H-level period of the second pulse. The duration of the H-level of the ENA signal is a fixed value since the signal is a frequency division signal of the OSC clock signal Frosc as a reference. For example, when Fref is set to 4.8 MHz, the duration of the H level of the ENA signal is about 416 ns.

When the ENA signal goes high, the counter increments the counting by the OSC clock signal Frosc. When the ENA signal goes low, the counting is stopped. At the trailing edge of a load signal delayed from the ENA signal only by the half cycle of the Fref signal, the Q output of each of the D-FFs in the counter is loaded to the D-FFs in the latch as a counter output. Immediately after that, the reset signal goes low, and the counter is initialized to zero but is not influenced by the latch.

In FIG. 8, as an example, each of the counter and the latch has the configuration of a 7-bit output. Specifically, in the counter, seven D flip flops are connected in series, the QC output of each of the D flip flops is fed back to D, the OSC clock signal Frosc is supplied to the first D flip flop, and a Q output of the D flip flop is supplied to the next D flip flop with respect to the second and subsequent D flip flops. The Q output of each D flip flop in the latch is output as a switch signal for determining a modulation reference bias current value output from the charge pump bias circuit 13b.

To be specific, as shown in FIG. 9, the OSC clock signal Frosc is supplied six times during the period of the H level of the ENA signal. "0001010" are output as the counter outputs 1 to 6 in parallel, that is, "6" is output.

Assuming now that the gate delay time of the OSC 15 fluctuates to the half, the oscillation frequency Frosc is doubled, a counter output is doubled, and "12" is output. On the contrary, when it is assumed that the gate delay time of the OSC 15 fluctuates to double, the oscillation frequency Frosc becomes the half, the counter output becomes the half, and "3" is output.

Figure 10:
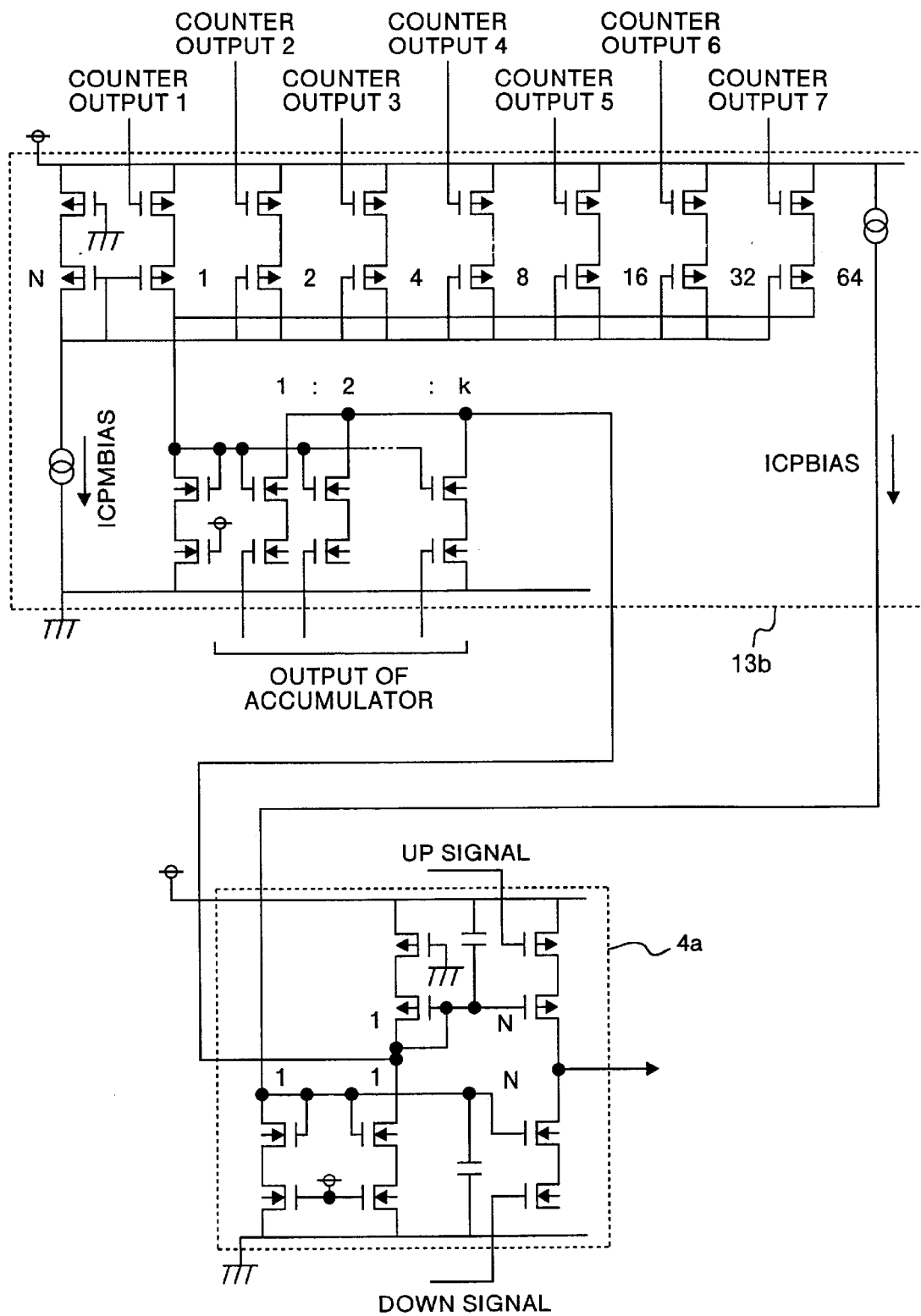
FIG. 10 is a circuit diagram of a charge pump circuit and a charge pump bias circuit in the second embodiment.

FIG. 10 shows the charge pump bias circuit 13b and the charge pump circuit 4a in the second embodiment.

The charge pump bias circuit 13b takes the form of a current mirror circuit in which a reference current value of the reference bias current ICPMBIAS is set as N, and which is constructed by P channel MOS transistors so as to set the mirror current ratio as 1/N, 2/N, . . . , 64/N. An output signal of the counter 16 is supplied as a gate switch of the P-channel MOS transistors. A current obtained by adding the current mirror currents is supplied to the charge pump circuit 4a.

As described above, by using the OSC 15, counter 16, and charge pump bias circuit 13b, variations in delay time of the NAND gates in the phase comparator 7 influenced by variations in device manufacturing process and variations in power source voltage, ambient temperature, and the like are canceled. Thus, spurious components can be suppressed by automatic adjustment at an optimum point.

Figure 11:
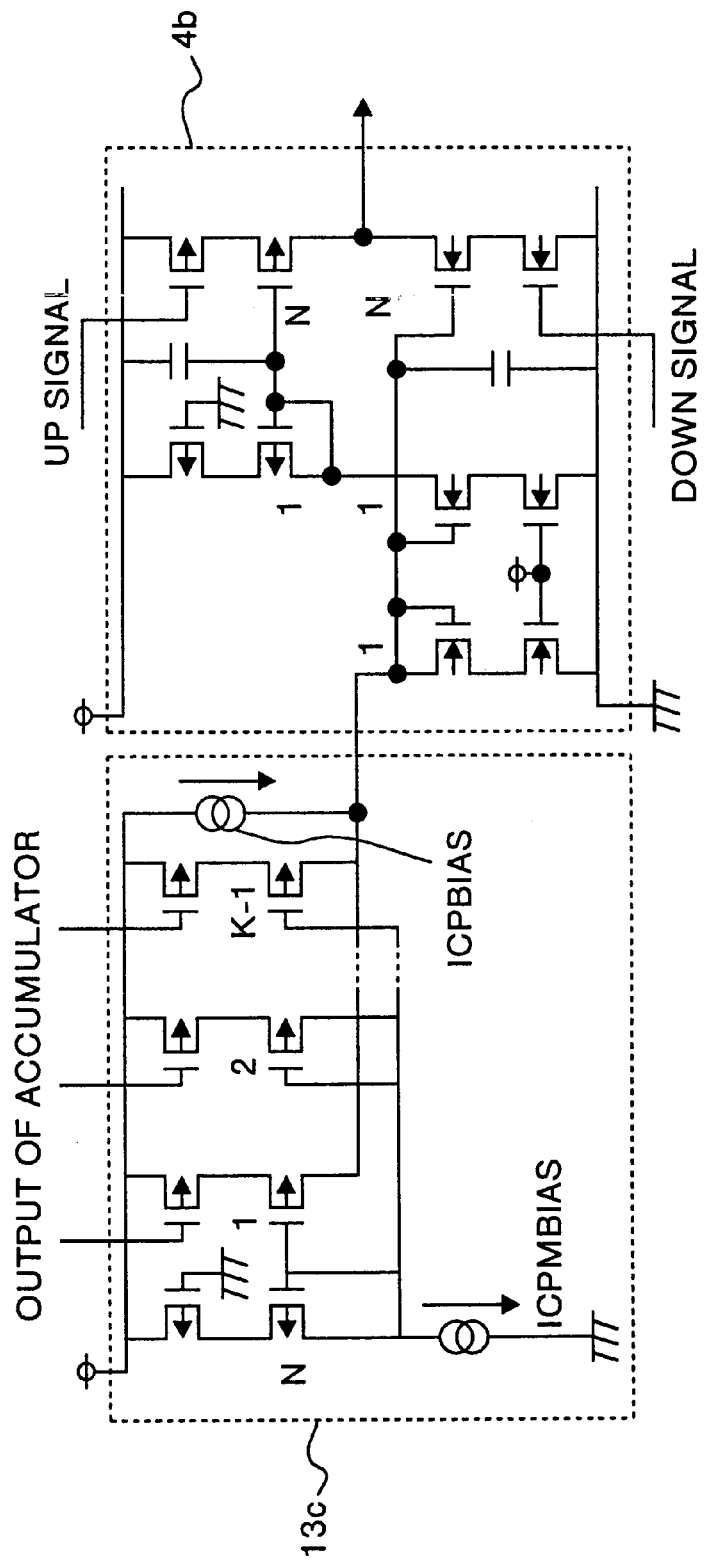
FIG. 11 is a circuit diagram of a charge pump circuit and a charge pump bias circuit in a third embodiment of this invention.

The basic configuration of the PLL frequency synthesizer according to the third embodiment of this invention is similar to that of FIG. 1. The difference is that, as shown in FIG. 11, the charge pump circuit 4b and charge pump bias circuit 13c are provided. The charge pump bias circuit 13c is characterized in that, to add a bias current inversely proportional to a phase error amount to the bias current ICPBIAS of the charge pump circuit 4b, an output signal of the accumulator 11 is supplied to the gates of P-channel MOS transistors in place of the N-channel MOS transistors as in the first and second embodiments.

Figure 12:
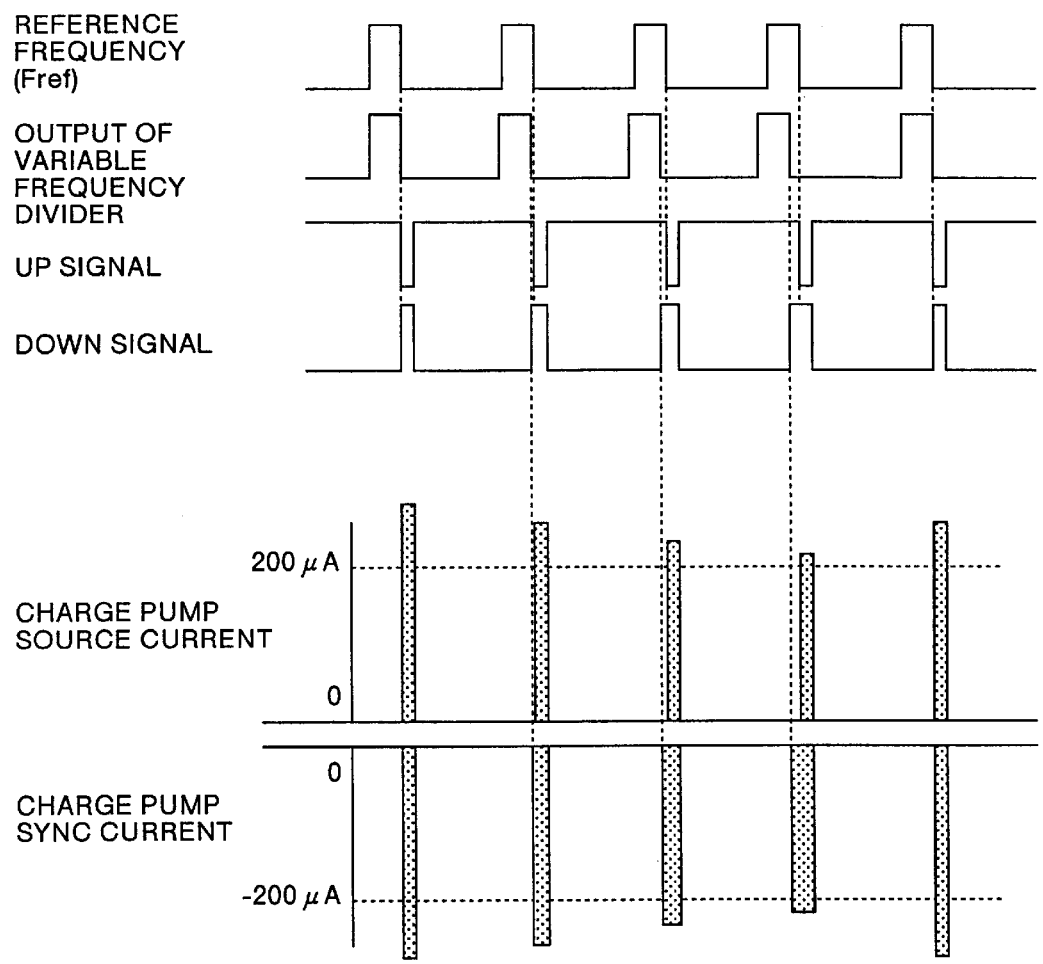
FIG. 12 is a diagram showing the relations among a reference frequency signal, an output signal of a variable frequency divider, and a phase error output in the third embodiment.
Figure 12:
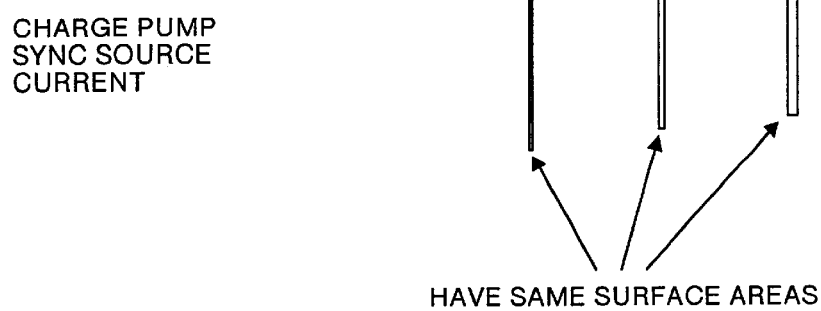

FIG. 12 shows a phase error output waveform. The phase error amount (charge pump current value×time) is output for each reference frequency signal Fref, and the maximum charge pump current flows where there is no phase error.

In the first and second embodiments, to cancel a phase error due to the sync current generated by the frequency dividing operation using the division value below the decimal point, the modulation current is added to the source current. In contrast, in the third embodiment, by adding the sync current inversely proportional to a phase error to the charge pump current, the area of a charge pump current generated due to a phase error is made constant. The phase error amount generated by the frequency dividing operation using the division value below the decimal point is consequently made constant, so that spurious frequency components caused by the frequency dividing operation using the division value below the decimal point are suppressed.

According to the present invention generation of the spurious components can be suppressed. Further, no dead zone is created in the phase comparator and the charge pump circuit. Further, no new spurious components are generated. Further, the configuration of the frequency synthesizer is simple and the size is compact. Further, the frequency synthesizer is not influenced by variations in delay time. In addition, signal of an oscillation period proportional to occurring delay time can be obtained.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A phase locked loop (PLL) frequency synthesizer that uses a fractional division value, said PLL frequency synthesizer comprising:

a phase comparator;
a voltage-controlled oscillator;
a charge pump circuit;
a loop filter;
a variable frequency divider periodically changing a division value in response to a division value changing circuit; and
a charge pump bias circuit which supplies a modulated reference bias current, for canceling a phase error, to said charge pump circuit.

2. The PLL frequency synthesizer according to claim 1, wherein said phase comparator simultaneously outputs an UP signal and a DOWN signal to said charge pump circuit for a predetermined period.

3. The PLL frequency synthesizer according to claim 2, wherein said charge pump circuit receives the modulated reference bias current and outputs a source current having an increment in response to the UP signal of said phase comparator.

4. The PLL frequency synthesizer according to claim 1, wherein said division value changing circuit includes an adder and an accumulator, and said adder produces an output supplied to said variable frequency divider, and said accumulator produces an output supplied to said charge pump bias circuit.

5. The PLL frequency synthesizer according to claim 4, wherein the modulated reference bias current is proportional to an input value from said accumulator and is added to a source current of said charge pump circuit.

6. The PLL frequency synthesizer according to claim 4, wherein the modulated reference bias current is inversely proportional to an input value from said accumulator and is added to a sink current of said charge pump circuit.

7. A phase locked loop (PLL) frequency synthesizer that uses a fractional divisional value, said PLL frequency synthesizer comprising:

a phase comparator;
a voltage-controlled oscillator;
a charge pump circuit;
a loop filter;
a variable frequency divider periodically changing a division value in response to a division value changing circuit;
a charge pump bias circuit which supplies a modulated reference bias current, for canceling a phase error, to said charge pump circuit, said phase comparator simultaneously outputting an UP signal and DOWN signal to said charge pump circuit for a predetermined period, and said charge pump circuit receiving the modulated reference bias current and outputting a source current having an increment in response to the UP signal of said phase comparator; and
a gate delay adjusting circuit which outputs a digital value proportional to fluctuation in delay time of said phase comparator, wherein the fluctuation in delay time of said phase comparator is canceled by adjusting the modulated reference bias current output from said charge pump bias circuit in response to said gate delay adjusting circuit.

8. The PLL frequency synthesizer according to claim 7, wherein said gate delay adjusting circuit includes a ring oscillator including 2-input NAND gates and a counter.

9. The PLL frequency synthesizer according to claim 8, wherein the 2-input NAND gates included in said ring oscillator have the same characteristics as those of a 2-input NAND gate used for said phase comparator.

* * * * *